(12) United States Patent
Chern et al.

(10) Patent No.: US 8,570,068 B2
(45) Date of Patent: Oct. 29, 2013

(54) CIRCUIT FOR REDUCING NEGATIVE BIAS TEMPERATURE INSTABILITY

(75) Inventors: Chan-Hong Chern, Palo Alto, CA (US);
Fu-Lung Hsueh, Cranbury, NJ (US);
Ming-Chieh Huang, San Jose, CA (US);
Bryan Sheffield, Austin, TX (US);
Chih-Chang Lin, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 155 days.

(21) Appl. No.: 12/768,899

(22) Filed: Apr. 28, 2010

(65) Prior Publication Data

US 2011/0267107 A1    Nov. 3, 2011

(51) Int. Cl.
*H03K 19/0175* (2006.01)

(52) U.S. Cl.
USPC .............................. 326/83; 326/98

(58) Field of Classification Search
USPC .......................... 326/83, 86, 93–98
See application file for complete search history.

(56) References Cited

U.S. PATENT DOCUMENTS

| | | | | |
|---|---|---|---|---|
| 4,680,487 A | * | 7/1987 | Kobayashi | 326/87 |
| 6,310,499 B1 | * | 10/2001 | Radjassamy | 327/175 |
| 6,433,586 B2 | * | 8/2002 | Ooishi | 326/93 |
| 6,448,812 B1 | * | 9/2002 | Bacigalupo | 326/83 |
| 6,522,171 B2 | * | 2/2003 | Hanson et al. | 326/95 |
| 6,809,546 B2 | * | 10/2004 | Song et al. | 326/30 |
| 6,809,570 B2 | * | 10/2004 | Francom | 327/178 |
| 7,058,827 B2 | * | 6/2006 | Rose et al. | 713/320 |
| 7,254,728 B2 | * | 8/2007 | Rose et al. | 713/320 |
| 7,884,640 B2 | * | 2/2011 | Greene et al. | 326/38 |
| 2004/0143769 A1 | * | 7/2004 | Deng et al. | 713/300 |
| 2007/0176642 A1 | * | 8/2007 | Kursun et al. | 326/98 |
| 2008/0258769 A1 | * | 10/2008 | Franger et al. | 326/58 |

FOREIGN PATENT DOCUMENTS

CN    1945499    4/2007

OTHER PUBLICATIONS

Office Action from corresponding application No. CN 201110021189.9.

* cited by examiner

*Primary Examiner* — Vibol Tan
(74) *Attorney, Agent, or Firm* — Lowe Hauptman & Ham, LLP

(57) ABSTRACT

A circuit includes an operational PMOS transistor of a logic gate driver. A control circuit is configured to turn off the operational PMOS transistor during a standby mode. The circuit also includes a sacrificial PMOS transistor coupled to an output node. The operational PMOS transistor is coupled to the output node. The sacrificial PMOS transistor is configured to keep the output node at a logical 1 during the standby mode.

20 Claims, 3 Drawing Sheets

CIRCUIT FOR REDUCING NEGATIVE BIAS TEMPERATURE INSTABILITY

TECHNICAL FIELD

The present disclosure relates generally to an integrated circuit, more particularly a logic gate driver.

BACKGROUND

In advanced process technology, Negative Bias Temperature Instability (NBTI) effect is a significant degradation source of transistors' threshold voltage (Vt) and currents (Idsat/Idlin). NBTI manifests as an increase in the threshold voltage (Vt) and consequent decrease in drive currents (Idsat/Idlin). Due to the NBTI degradation on transistors' Vt and Idsat/Idlin, the affected transistor's speed is reduced and may cause significant timing issues, such as max delay paths and detrimental min-delay paths (i.e., delay mismatch between generating and sampling paths).

In particular, NBTI can happen when a PMOS transistor undergoes a constant stress, such as in a clock gating (e.g., not allowing a clock signal to pass through) or standby mode (i.e., not in active operation) situation in an effort to reduce chips' dynamic power consumption. For example, in some applications, a relatively large inverter driver and an output node are parked at a logical 1 state using an operational PMOS transistor during a clock gating or standby mode situation.

Conventional methods to deal with NBTI includes: 1) guard banding (i.e., taking out some initially available operation frequency, e.g., shipping a chip at 1 GHz when 1.2 GHz is initially available), 2) gate sizing, and 3) Vdd and Vt tuning, etc. However, the drawbacks for these methods include: 1) sacrificing chips' initially available performance by as much as 10-15% for guard banding, 2) an area overhead of 10-20% and the accompanying power consumption increase for gate sizing, and 3) aggravating NBTI degradation for Vdd/Vt tuning.

Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable concepts that can be embodied in a wide variety of specific contexts. The specific embodiments discussed are merely illustrative of specific ways to make and use, and do not limit the scope of the disclosure.

Figure 1:
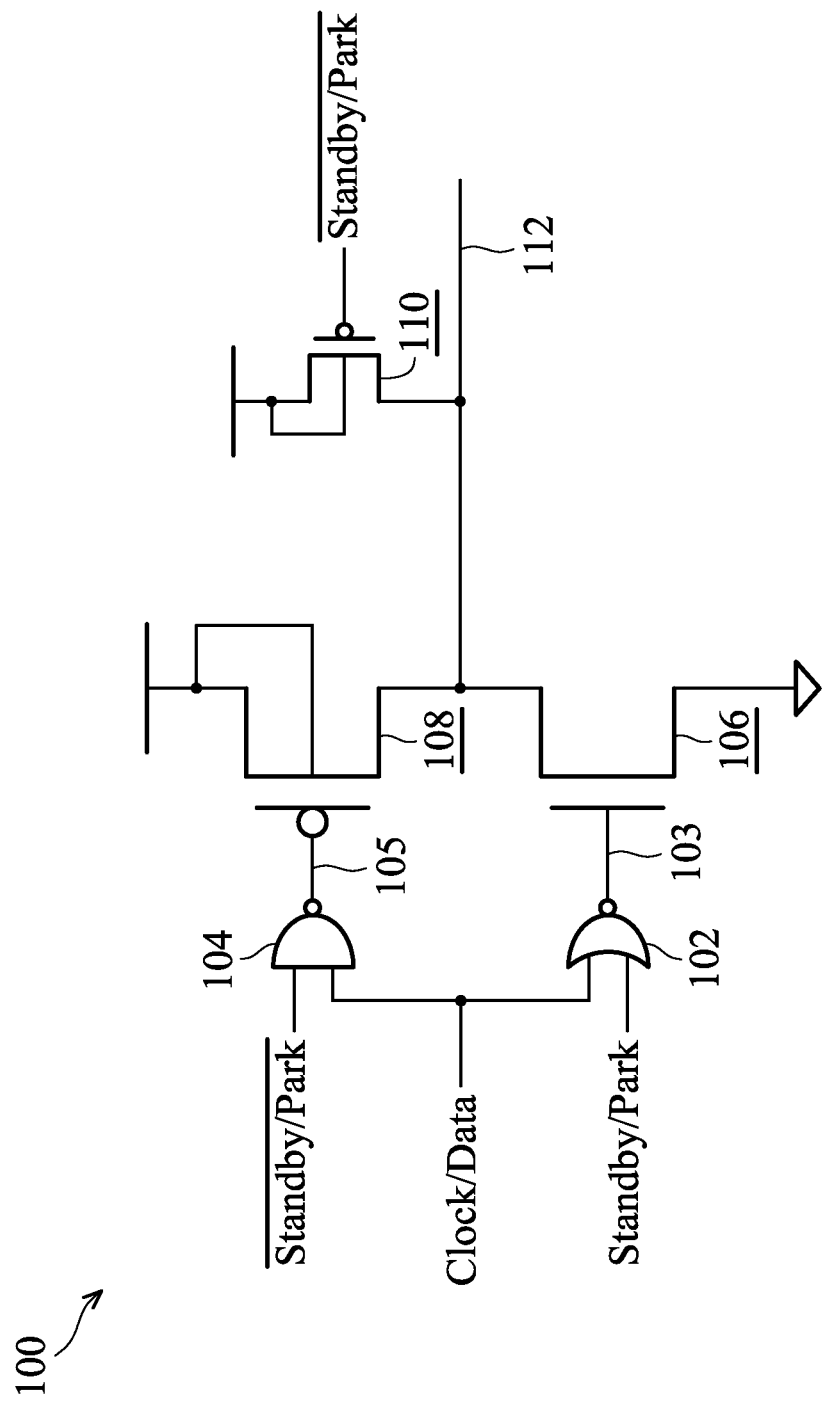
FIG. 1 is a schematic diagram showing an exemplary a circuit to eliminate NBTI damage in a logic gate driver according to some embodiments.

FIG. 1 is a schematic diagram showing an exemplary circuit to eliminate NBTI damage in a logic gate driver according to some embodiments. The circuit 100 is a logic gate (i.e., inverter with control logics) driver and has an output node 112 that is logically required to park at a logical 1 state in a clock gating (e.g., not allowing a clock signal to pass through) or standby mode (i.e., not in active operation) situation. In the description below, a "standby" mode refers to clock gating, standby situations, and/or other similar situations (e.g., sleep mode, etc.).

The circuit 100 includes a NOR gate 102 coupled to an NMOS transistor 106. A control circuit comprising, for example, a NAND gate 104, is coupled to an operational PMOS transistor 108. The control circuit is configured to turn off the operational PMOS transistor 108 during the standby mode. The operational PMOS transistor 108 and the NMOS transistor 106 are coupled to the output node 112. A PMOS transistor 110 is also coupled to the output node 112 and keeps the output node 112 at a logical 1 during the standby mode. A clock/data signal and a standby/park signal are coupled to the NOR gate 102. The clock/data signal and a complementary standby/park bar signal are coupled to the control circuit. The complementary standby/park bar signal is also coupled to the PMOS transistor 110.

When the standby/park signal is asserted (logical 1), the complementary standby/park bar signal (logical 0) coupled to the NAND gate 104 makes the NAND gate 104's inverted signal 105 a logical 1, which turns off the operational PMOS transistor 108. The standby/park bar signal (logical 0) is also coupled to the PMOS transistor 110, which is turned on to keep the output node 112 at a logical 1 (and charge up the output node 112 to a logical 1 as logically required). Further, the standby/park signal (logical 1) is coupled to the NOR gate 102, thus the NOR gate 102's output 103 is a logical 0, which turns off the NMOS transistor 106. The size of the NOR gate 102 can be relatively small (e.g. ½) compared to a NOR gate that is coupled to both the PMOS transistor and NMOS transistor in other conventional circuits. In summary, the operational PMOS transistor 108 is turned off and the output node 112 is kept at a logical 1 when the standby/park signal is asserted (logical 1).

When the standby/park signal is not asserted (logical 0), the complementary standby/park bar signal (logical 1) coupled to the NAND gate 104 makes the clock/data signal go through the NAND gate 104 as the inverted signal 105, which is coupled to the gate of the operational PMOS transistor 108. Also, because the standby/park signal coupled to the NOR gate 102 is a logical 0, the clock/data signal goes through the NOR gate 102 as an inverted signal 103, which is coupled to the NMOS transistor 106. If the clock/data signal is a logical 0, the inverted signal 105 (logical 1) turns off the operational PMOS transistor 108, and the inverted signal 103 (logical 1) turns on the NMOS transistor 106, to pull down the output node 112 to a logical 0. If the clock/data signal is a logical 1, the inverted signal 105 (logical 0) turns on the operational PMOS transistor 108, and the inverted signal 103 (logical 0) turns off the NMOS transistor 106, to pull up the output node 112 to a logical 1. In summary, the output node 112 follows the clock/data signal when the standby/park signal is not asserted (logical 0).

The circuit 100 is useful for a relatively large inverter driver and an output node logically required to park at a logical 1 state in a clock gating or standby mode situation. By turning off the operational PMOS transistor 108 during standby/park mode, the NBTI degradation on the operational PMOS transistor 108 can be eliminated. Even though a PMOS transistor (not shown) in the NAND gate 104 may be stressed during the standby mode, the PMOS transistor in the NAND gate 104 is not in the clock/data signal path so it is of no concern. The PMOS transistor in the NAND gate 104 can be referred to as a sacrificial PMOS transistor. Also, the PMOS transistor 110 that keeps the output node 112 at the logical 1 during a standby mode may be also stressed, but it is not in the clock/data signal path, either. The PMOS transistor 110 can be also referred to as a sacrificial PMOS transistor. The PMOS transistor 110 can be shared by a group of logic gates that use the same standby/park signal.

Figure 2:
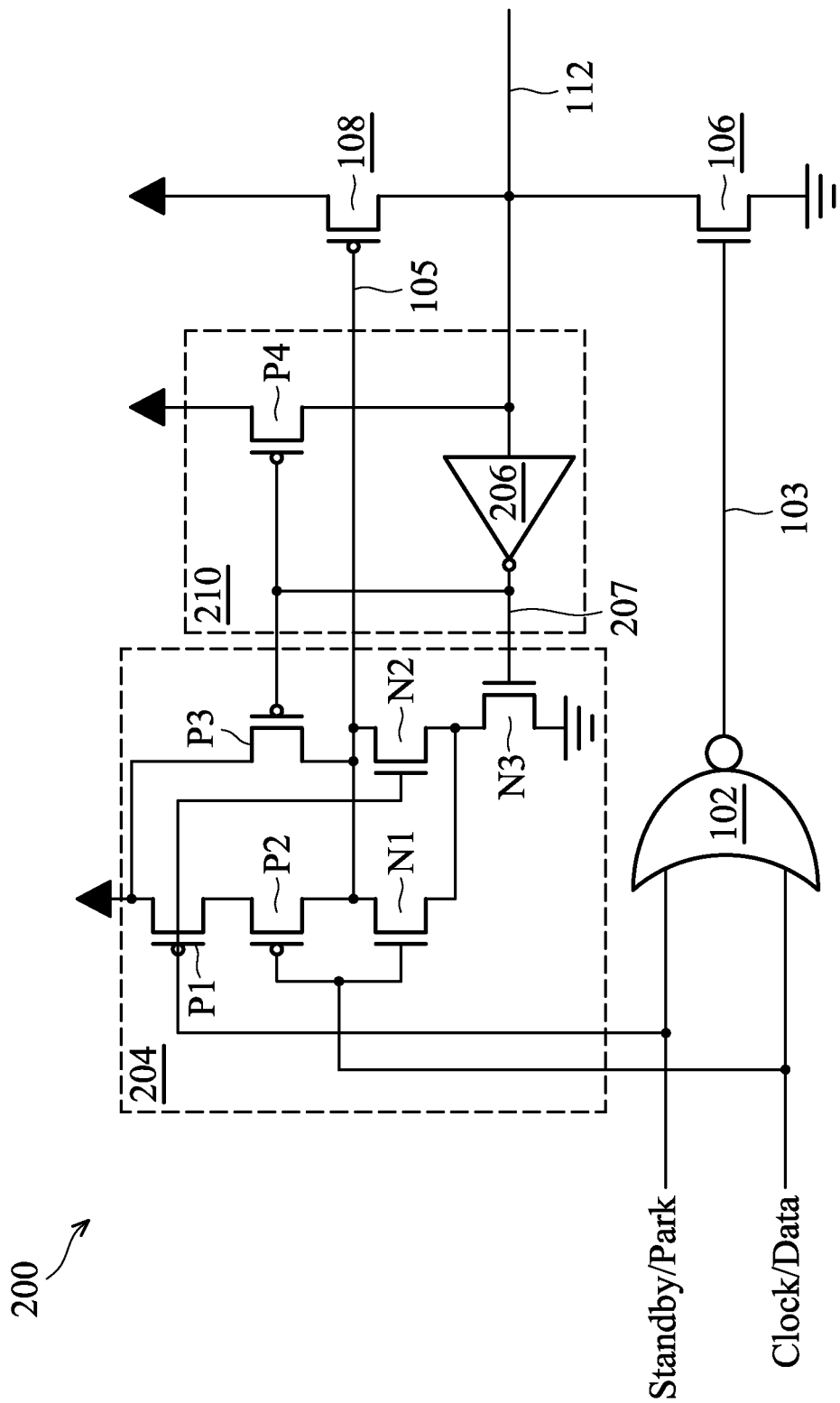
FIG. 2 is a schematic diagram showing another exemplary circuit to eliminate NBTI in a logic gate driver according to some embodiments.

FIG. 2 is a schematic diagram showing another exemplary circuit to eliminate NBTI impacts to a logic gate driver according to some embodiments. The circuit 200 is a logic gate (i.e., inverter with control logics) driver and has an output node 112 that is logically required to park at a logical 1 state during a standby mode. The circuit 200 includes a control circuit 204 and a half latch keeper circuit 210. In this embodiment, the control circuit 204 includes a NOR gate (comprising transistors P1, P2, N1, and N2), a PMOS transistor P3, and an NMOS transistor N3. The control circuit 204 is coupled to a half latch keeper circuit 210 (comprising a PMOS transistor P4 and an inverter 206). The control circuit 204 is also coupled to the operational PMOS transistor 108 and turns off the operational PMOS transistor 108 during the standby mode. A NOR gate 102 is coupled to an NMOS transistor 106 that is coupled to the output node 112. A clock/data signal and a standby/park signal are coupled to the NOR gate 102 and the control circuit 204.

The half latch keeper circuit 210 is coupled to the output node 112 and keeps the output node 112 at a logical 1 during the standby mode. The size of the NOR gate 102 and/or the NOR gate (comprising transistors P1, P2, N1, and N2) in the control circuit 204 can be relatively small (e.g. ½) compared to a NOR gate that is coupled to both the PMOS transistor and NMOS transistor in other conventional circuits.

When the standby/park signal is asserted (logical 1), the NOR gate 102's output 103 is a logical 0, which turns off the NMOS transistor 106. The standby/park signal (logical 1) turns n the NMOS transistor N2. If the output node 112 had a logical 0, the inverter 206 inverts the logical 0 to a logical 1 and turns on the NMOS transistor N3. In this case, the NMOS transistors N2 and N3 pull down the inverted signal 105 to turn on the operational PMOS transistor 108, which in turn pull up the output node 112 to a logical 1. After the output node 112 becomes a logical 1, the inverter 206 provides an inverted output 207 (logical 0) to the gate of the NMOS transistor N3 to turn off the NMOS transistor N3. The inverted output 207 (logical 0) also turns on a PMOS transistor P3 to pull up the inverted signal 105 to a logical 1, which turns off the operational PMOS transistor 108. A PMOS transistor P4 is also turned on and keeps the output node 112 at the logical 1.

If the output node 112 had a logical 1, the inverter 206 inverts the logical 1 to a logical 0 and turns off the NMOS transistor N3. The inverted output 207 (logical 0) also turns on PMOS transistors P3 and P4. The PMOS transistor P3 keeps the inverted signal 105 at logical 1 to turn off the operational PMOS transistor 108. Even though the PMOS transistor P3 may be stressed during the standby mode, the PMOS transistor P3 is not in the clock/data signal path. The PMOS transistor P3 can be referred to as a sacrificial PMOS transistor. The PMOS transistor P4 keeps the output node 112 at logical 1 during the standby mode. Even though the PMOS transistor P4 may be stressed during the standby mode, the PMOS transistor P4 is not in the clock/data signal path, either. The PMOS transistor P4 can be also referred to as a sacrificial PMOS transistor.

When the standby/park signal is not asserted (logical 0), the NOR gate 102's output 103 is an inverted signal of the clock/data signal. If the clock/data signal is a logical 1, the NOR gate 102's output 103 becomes a logical 0, which turns off the NMOS transistor 106 to keep the output node 112 at a logical 1. If the clock/data signal is a logical 0, the NOR gate 102's output 103 becomes a logical 1, which turns on the NMOS transistor 106 to pull down the output node 112 to a logical 0. The NMOS transistor 106 has larger drive strength than the PMOS transistor P4 in the half latch keeper circuit 210 to pull down the output node 112 to a logical 0. The inverter 206's output 207 becomes a logical 1 to turn on the NMOS transistor N3 and turn off the PMOS transistors P3 and P4. If the clock/data signal changes from a logical 0 to a logical 1, an NMOS transistor N1 is turned on and the inverted signal 105 is pulled down through the NMOS transistors N1 and N3 to a logical 0 to turn on the operational PMOS transistor 108, which pulls up the output node 112 to a logical 1. Therefore, the output node 112 follows the clock/data signal when the standby/park signal is not asserted.

The control circuit 204 and the sacrificial PMOS transistors P3 and P4 can be made relatively small compared to a very large inverter driver of a logic gate. Therefore, the circuit 200 does not add significant chip area overhead in some embodiments. The control circuit 204 and the sacrificial PMOS transistors P3 and P4 can be shared by a group of logic gates to further save chip area.

Figure 3:
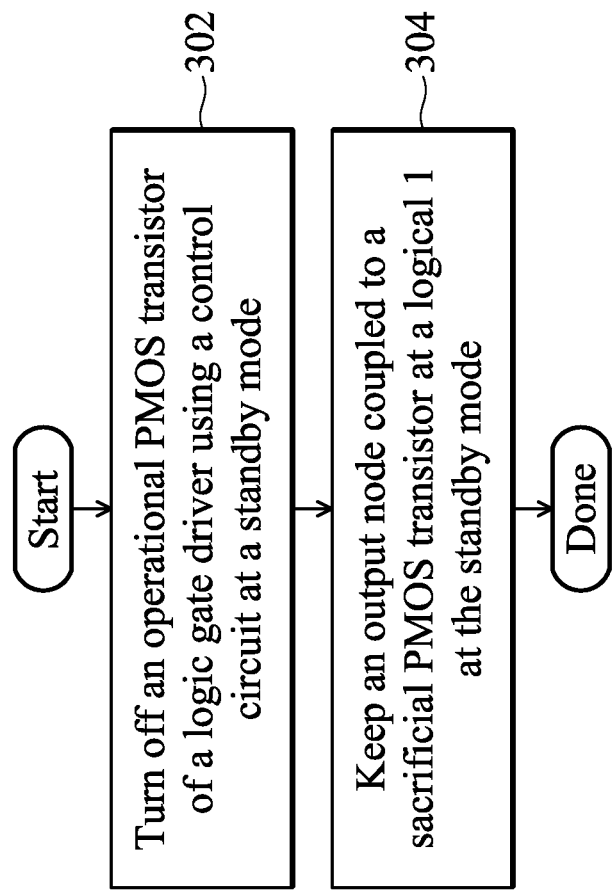
FIG. 3 is a flow diagram showing an exemplary method for the circuit shown in FIG. 1 and FIG. 2 according to some embodiments.

FIG. 3 is a flow diagram showing an exemplary method for the circuit shown in FIG. 1 and FIG. 2 according to some embodiments. At step 302, an operational PMOS transistor 108 of a logic gate driver is turned off using a control circuit, e.g., 104 or 204, at a standby mode. At step 304, an output node 112 coupled to a sacrificial PMOS transistor, e.g., 110 or P4, is kept at a logical 1 at the standby mode.

In some embodiments, a standby signal and/or a clock signal is supplied to the control circuit, e.g., 104 or 204. In some embodiments, a half latch keeper circuit, e.g., 210, keeps the output node 112 at logical 1 during the standby mode. In some embodiments, the control circuit, e.g., 204, includes a sacrificial PMOS transistor, e.g., P3.

A skilled person in the art will appreciate that there can be many embodiment variations of this disclosure. Although embodiments and their features have been described in detail, it should be understood that various changes, substitutions and alterations can be made herein without departing from the spirit and scope of the embodiments as defined by the appended claims. For example, the same technique and circuit implementation described above can be applied to and shared by different types of logic gates, such as NAND and NOR gates. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

What is claimed is:

1. A circuit, comprising:
   an operational PMOS transistor of a logic gate driver;
   a control circuit configured to turn off the operational PMOS transistor during a standby mode;
   a first PMOS transistor; and
   an output node;
   wherein the operational PMOS transistor is coupled to the output node and the first PMOS transistor is configured to keep the output node at a logical 1 during the standby mode, and a gate of the first PMOS transistor is coupled to an output of an inverter and a drain of the first PMOS transistor is coupled to an input of the inverter, the control circuit includes a second PMOS transistor coupled to the operational PMOS transistor for turning off the operational PMOS transistor during a standby mode, and the second PMOS is outside a signal path of a clock signal.

2. The circuit of claim 1, wherein a standby signal and a clock signal are coupled to the control circuit.

3. The circuit of claim 1, wherein an NMOS transistor is coupled to the operational PMOS transistor and the output node.

4. The circuit of claim 3, wherein a standby signal and a clock signal are coupled to a NOR gate and the NOR gate is coupled to a gate of the NMOS transistor.

5. The circuit of claim 1, wherein the control circuit comprises a NOR gate.

6. The circuit of claim 1, wherein a gate of the first PMOS transistor and a gate of the second PMOS transistor are coupled together.

7. A method, comprising:
   turning off an operational PMOS transistor of a logic gate driver by a control circuit during a standby mode, wherein turning off the operational PMOS transistor comprises processing a standby signal and a clock signal through a first NOR gate; and
   keeping an output node at a logical 1 during the standby mode by a first PMOS transistor coupled to the output node.

8. The method of claim 7, further comprising coupling the standby signal and the clock signal to a second NOR gate coupled to a gate of an NMOS transistor, wherein the NMOS transistor is capable of pulling down the output node.

9. The method of claim 7, wherein turning off an operational PMOS transistor comprises turning on a second PMOS transistor in the control circuit to supply a logical 1 to the operational PMOS transistor.

10. The method of claim 9, further comprising coupling a gate of the first PMOS transistor and a gate of the second PMOS transistor.

11. A circuit, comprising:
    an operational PMOS transistor of a logic gate driver;
    a control circuit configured to turn off the operational PMOS transistor during a standby mode;
    a first PMOS transistor configured to receive a standby signal,
    an output node coupled to the operational PMOS transistor; and
    an NMOS transistor that is coupled to the operational PMOS transistor and the output node,
    wherein the standby signal and a clock signal are coupled to the control circuit, and the first PMOS transistor is configured to keep the output node at a logical 1 during the standby mode, and a gate of the operational PMOS transistor is coupled to a first NOR gate, and a gate of the NMOS transistor is coupled to a second NOR gate separate from the first NOR gate.

12. The circuit of claim 11, wherein the standby signal and the clock signal are coupled to the second NOR gate.

13. The circuit of claim 11, wherein a gate of the first PMOS transistor is coupled to an output of an inverter and a drain of the first PMOS transistor is coupled to an input of the inverter.

14. The circuit of claim 11, wherein the control circuit includes a second PMOS transistor coupled to the operational PMOS transistor to turn off the operational PMOS transistor during a standby mode.

15. The circuit of claim 3, wherein a gate of the operational PMOS transistor is coupled to a first NOR gate, and a gate of the NMOS transistor is coupled to a second NOR gate separate from the first NOR gate.

16. The method of claim 7, wherein keeping the output node at a logical 1 comprises coupling a gate of the first PMOS transistor to an output of an inverter and coupling a drain of the first PMOS transistor to an input of the inverter.

17. The method of claim 8, wherein the first NOR gate is separate from the second NOR gate.

18. The circuit of claim 14, wherein the second PMOS is outside a signal path of the clock signal.

19. The circuit of claim 14, wherein a gate of the first PMOS transistor and a gate of the second PMOS transistor are coupled together.

20. The circuit of claim 11, further comprising an inverted coupled between the output node and the control circuit.

* * * * *